(12) United States Patent
Raisanen et al.

(10) Patent No.: US 9,177,784 B2
(45) Date of Patent: Nov. 3, 2015

(54) SEMICONDUCTOR DEVICE DIELECTRIC INTERFACE LAYER

(71) Applicant: ASM IP Holding B.V., Almere (NL)

(72) Inventors: Petri Raisanen, Chandler, AZ (US); Michael Givens, Phoenix, AZ (US); Mohith Verghese, Phoenix, AZ (US)

(73) Assignee: ASM IP Holdings B.V., Almere (NL)

( * ) Notice: Subject to any disclaimer, the term of this patent is extended or adjusted under 35 U.S.C. 154(b) by 0 days.

(21) Appl. No.: 14/183,187

(22) Filed: Feb. 18, 2014

(65) Prior Publication Data

US 2014/0159170 A1 Jun. 12, 2014

Related U.S. Application Data

(63) Continuation of application No. 13/465,340, filed on May 7, 2012, now Pat. No. 8,728,832.

(51) Int. Cl.
*H01L 21/285* (2006.01)
*H01L 21/336* (2006.01)
(Continued)

(52) U.S. Cl.
CPC ........ *H01L 21/02233* (2013.01); *H01L 21/022* (2013.01); *H01L 21/0214* (2013.01); *H01L 21/0223* (2013.01); *H01L 21/0228* (2013.01); *H01L 21/02164* (2013.01); *H01L 21/02172* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01);
(Continued)

(58) Field of Classification Search
CPC .............. H01L 21/0223; H01L 21/02233; H01L 21/02236; H01L 21/02238; H01L 21/02241; H01L 21/02249; H01L 21/02252; H01L 21/0214; H01L 21/02164; H01L 21/02172; H01L 21/02178; H01L 21/02181; H01L 21/02183; H01L 21/02186; H01L 21/02189; H01L 21/02192; H01L 21/02197
USPC ........................................... 438/197; 257/288
See application file for complete search history.

(56) References Cited

U.S. PATENT DOCUMENTS 2,745,640 A 5/1956 Cushman
2,990,045 A 9/1959 Root
(Continued)

FOREIGN PATENT DOCUMENTS

CN 1563483 1/2005
CN 101330015 12/2008
(Continued)

OTHER PUBLICATIONS

USPTO; Final Office Action dated Jul. 14, 2014 in U.S. Appl. No. 12/754,223.
(Continued)

*Primary Examiner* — Victor A Mandala
*Assistant Examiner* — Regan J Rundio
(74) *Attorney, Agent, or Firm* — Snell & Wilmer LLP

(57) ABSTRACT

Embodiments related to methods for forming a film stack on a substrate are provided. One example method comprises exposing the substrate to an activated oxygen species and converting an exposed surface of the substrate into a continuous monolayer of a first dielectric material. The example method also includes forming a second dielectric material on the continuous monolayer of the first dielectric material without exposing the substrate to an air break.

20 Claims, 5 Drawing Sheets

(51) Int. Cl.
*H01L 21/31* (2006.01)
*H01L 21/66* (2006.01)
*H01L 21/02* (2006.01)
*H01L 29/51* (2006.01)
*H01L 29/78* (2006.01)
*H01L 21/28* (2006.01)

(52) U.S. Cl.
CPC .... *H01L21/02197* (2013.01); *H01L 21/02236* (2013.01); *H01L 21/02238* (2013.01); *H01L 21/02247* (2013.01); *H01L 21/02249* (2013.01); *H01L 21/02252* (2013.01); *H01L 21/02304* (2013.01); *H01L 21/02315* (2013.01); *H01L 21/28202* (2013.01); *H01L 21/28211* (2013.01); *H01L 22/20* (2013.01); *H01L 29/511* (2013.01); *H01L 29/512* (2013.01); *H01L 29/513* (2013.01); *H01L 29/517* (2013.01); *H01L 21/28194* (2013.01); *H01L 22/12* (2013.01)

(56) References Cited

U.S. PATENT DOCUMENTS

| | | |
|---|---|---|
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,436,674 A | 3/1984 | McMenamin |
| 4,499,354 A | 2/1985 | Hill et al. |
| 4,512,113 A | 4/1985 | Budinger |
| 4,570,328 A | 2/1986 | Price et al. |
| D288,556 S | 3/1987 | Wallgren |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,986,215 A | 1/1991 | Yamada |
| 4,991,614 A | 2/1991 | Hammel |
| 5,062,386 A | 11/1991 | Christensen |
| 5,074,017 A | 12/1991 | Toya et al. |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,421,893 A | 6/1995 | Perlov |
| 5,422,139 A | 6/1995 | Fischer |
| 5,518,549 A | 5/1996 | Hellwig |
| 5,595,606 A | 1/1997 | Fujikawa et al. |
| 5,616,947 A | 4/1997 | Tamura |
| 5,632,919 A | 5/1997 | MacCracken et al. |
| 5,681,779 A | 10/1997 | Pasch et al. |
| 5,695,567 A | 12/1997 | Kordina |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace et al. |
| 6,015,465 A | 1/2000 | Kholodenko et al. |
| 6,035,101 A | 3/2000 | Sajoto et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,160,244 A | 12/2000 | Ohashi |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 | 5/2003 | Arai et al. |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,645,304 B2 | 11/2003 | Yamaguchi |
| 6,648,974 B1 | 11/2003 | Ogliari et al. |
| 6,673,196 B1 | 1/2004 | Oyabu |
| 6,682,973 B1 * | 1/2004 | Paton et al. .................. 438/240 |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian et al. |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |

(56) References Cited

U.S. PATENT DOCUMENTS

| | | |
|---|---|---|
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,238,596 B2 | 7/2007 | Kouvetakis et al. |
| D553,104 S | 10/2007 | Oohashi et al. |
| 7,298,009 B2 | 11/2007 | Yan et al. |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,431,966 B2 | 10/2008 | Derderian et al. |
| 7,437,060 B2 | 10/2008 | Wang et al. |
| 7,442,275 B2 | 10/2008 | Cowans |
| 7,489,389 B2 | 2/2009 | Shibazaki |
| D593,969 S | 6/2009 | Li |
| 7,547,363 B2 | 6/2009 | Tomiyasu et al. |
| 7,575,968 B2 | 8/2009 | Sadaka et al. |
| 7,589,003 B2 | 9/2009 | Kouvetakis et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,838,084 B2 | 11/2010 | Derderian et al. |
| 7,851,019 B2 | 12/2010 | Tuominen et al. |
| 7,884,918 B2 | 2/2011 | Hattori |
| D634,719 S | 3/2011 | Yasuda et al. |
| 8,041,197 B2 | 10/2011 | Kasai et al. |
| 8,055,378 B2 | 11/2011 | Numakura |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,444,120 B2 | 5/2013 | Gregg et al. |
| 8,506,713 B2 | 8/2013 | Takagi |
| D691,974 S | 10/2013 | Osada et al. |
| 8,608,885 B2 | 12/2013 | Goto et al. |
| 8,683,943 B2 | 4/2014 | Onodera et al. |
| 8,711,338 B2 | 4/2014 | Liu et al. |
| D705,745 S | 5/2014 | Kurs et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| D716,742 S | 11/2014 | Jang et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,029,253 B2 | 5/2015 | Milligan et al. |
| 9,096,931 B2 | 8/2015 | Yednak et al. |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0141820 A1 | 7/2003 | White et al. |
| 2003/0168001 A1 | 9/2003 | Sneh |
| 2003/0180458 A1 | 9/2003 | Sneh |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0101622 A1 | 5/2004 | Park et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0123690 A1 | 6/2005 | Derderian et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2005/0287725 A1 | 12/2005 | Kitagawa |
| 2006/0013946 A1 | 1/2006 | Park et al. |
| 2006/0014384 A1 | 1/2006 | Lee et al. |

(56) References Cited

U.S. PATENT DOCUMENTS

| | | |
|---|---|---|
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1* | 5/2006 | Fukuchi ............ 438/778 |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0163612 A1 | 7/2006 | Kouvetakis et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0248310 A1 | 10/2008 | Kim et al. |
| 2008/0261413 A1 | 10/2008 | Mahajani |
| 2008/0277715 A1* | 11/2008 | Ohmi et al. ............ 257/321 |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1* | 1/2009 | Yamashita et al. ............ 438/788 |
| 2009/0035947 A1 | 2/2009 | Horii et al. |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1* | 10/2009 | Yang et al. ............ 257/57 |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1* | 3/2010 | Chang et al. ............ 438/763 |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0162752 A1 | 7/2010 | Tabata et al. |
| 2010/0170441 A1* | 7/2010 | Won et al. ............ 118/723.1 |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1* | 11/2010 | Kitagawa ............ 118/723 AN |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1* | 9/2011 | Fox et al. ............ 427/579 |
| 2011/0239936 A1 | 10/2011 | Suzuki et al. |
| 2011/0254052 A1 | 10/2011 | Kouvetakis |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2013/0330911 A1 | 12/2013 | Huang et al. |
| 2014/0000843 A1 | 1/2014 | Dunn et al. |
| 2014/0014644 A1 | 1/2014 | Akiba et al. |
| 2014/0020619 A1 | 1/2014 | Vincent et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |

(56) References Cited

U.S. PATENT DOCUMENTS

| | | | |
|---|---|---|---|
| 2014/0073143 | A1 | 3/2014 | Alokozai et al. |
| 2014/0077240 | A1 | 3/2014 | Roucka et al. |
| 2014/0084341 | A1 | 3/2014 | Weeks |
| 2014/0087544 | A1 | 3/2014 | Tolle |
| 2014/0103145 | A1 | 4/2014 | White et al. |
| 2014/0120487 | A1 | 5/2014 | Kaneko |
| 2014/0175054 | A1 | 6/2014 | Carlson et al. |
| 2014/0217065 | A1 | 8/2014 | Winkler et al. |
| 2014/0220247 | A1 | 8/2014 | Haukka et al. |
| 2014/0225065 | A1 | 8/2014 | Rachmady et al. |
| 2014/0251953 | A1 | 9/2014 | Winkler et al. |
| 2014/0251954 | A1 | 9/2014 | Winkler et al. |
| 2014/0346650 | A1 | 11/2014 | Raisanen et al. |
| 2015/0004316 | A1 | 1/2015 | Thompson et al. |
| 2015/0014632 | A1 | 1/2015 | Kim et al. |
| 2015/0024609 | A1 | 1/2015 | Milligan et al. |
| 2015/0048485 | A1 | 2/2015 | Tolle |
| 2015/0091057 | A1 | 4/2015 | Xie et al. |
| 2015/0096973 | A1 | 4/2015 | Dunn et al. |
| 2015/0132212 | A1 | 5/2015 | Winkler et al. |
| 2015/0140210 | A1 | 5/2015 | Jung et al. |
| 2015/0147877 | A1 | 5/2015 | Jung |
| 2015/0167159 | A1 | 6/2015 | Halpin et al. |
| 2015/0184291 | A1 | 7/2015 | Alokozai et al. |
| 2015/0187568 | A1 | 7/2015 | Pettinger et al. |

FOREIGN PATENT DOCUMENTS

| | | |
|---|---|---|
| CN | 101522943 | 9/2009 |
| CN | 101423937 | 9/2011 |
| EP | 2036600 | 3/2009 |
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 1226380 | 1/2005 |
| TW | 200701301 | 1/2007 |
| WO | 2006/056091 | 6/2006 |
| WO | 2006/078666 | 7/2006 |

OTHER PUBLICATIONS

USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO; Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.

(56) References Cited

OTHER PUBLICATIONS

USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 110, pp. 043535-1-043535-6, (2011).
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Metal Halides on Thermal, Mechanical, and Electrical Properties of Polypyromelitimide Films," Journal of Applied Polymer Science, vol. 32, pp. 3987-4000, (1986).
USPTO; Final Office Action dated Aug. 12, 2015 in U.S. Appl. No. 12/754,223.
USPTO; Non-Final Office Action dated Jun. 17, 2015 in U.S. Appl. No. 13/283,408.

(56) References Cited

OTHER PUBLICATIONS

USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.

* cited by examiner

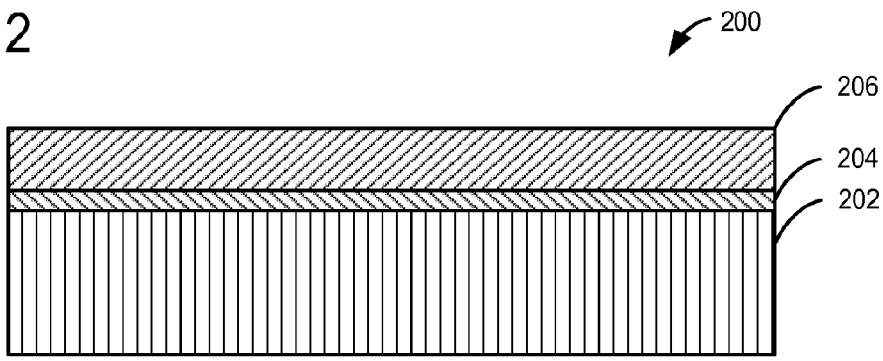
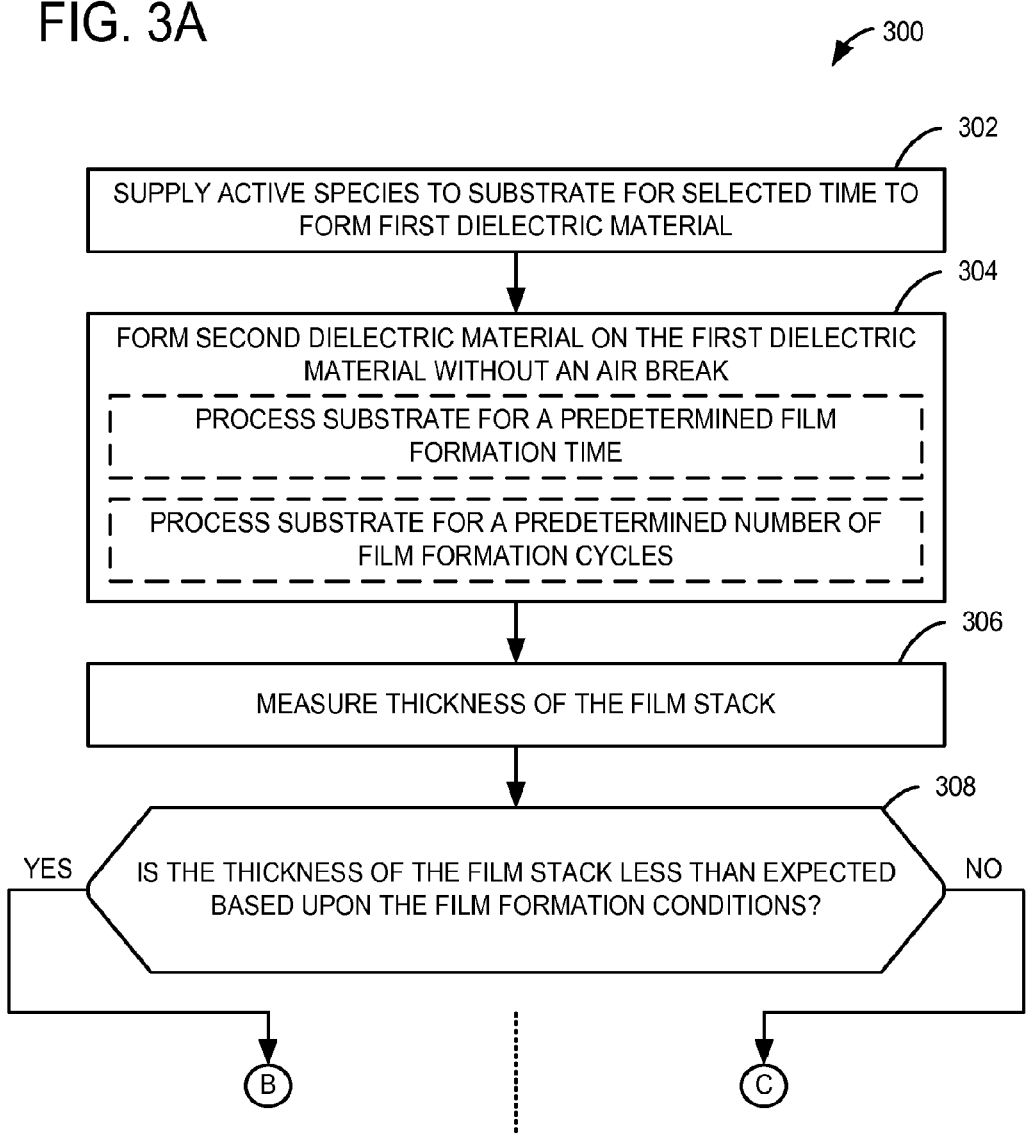

//www.w3.org/1999/xhtml">
SEMICONDUCTOR DEVICE DIELECTRIC INTERFACE LAYER

This application is a continuation of and claims priority to U.S. patent application Ser. No. 13/465,340, filed May 7, 2012, the contents of which are incorporated herein by reference.

BACKGROUND

Some semiconductor devices employ a high-K dielectric material (relative to $SiO_2$) as a gate dielectric to achieve a desired equivalent oxide thickness (EOT) for the device. The high-K dielectric material may provide a film that is sufficiently thick to avoid undesirable leakage while providing other desirable electrical properties. However, forming a high-K dielectric material directly on some substrates may lead to interactions between the substrate and the high-K dielectric material that may undesirably alter device performance.

SUMMARY

Various embodiments are disclosed herein that relate to methods for forming a film stack on a substrate. One example method comprises exposing the substrate to an activated oxygen species and converting an exposed surface of the substrate into a continuous monolayer of a first dielectric material. The example method also includes forming a second dielectric material on the continuous monolayer of the first dielectric material without exposing the substrate to an air break.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 2 schematically shows a film stack including a continuous monolayer of a first dielectric material covered by a second dielectric material according to an embodiment of the present disclosure.

FIG. 3A shows a flowchart illustrating a portion of a method for determining a conversion time associated with converting an exposed surface of a substrate into a continuous monolayer of a first dielectric material according to an embodiment of the present disclosure.

DETAILED DESCRIPTION

Figure 1:
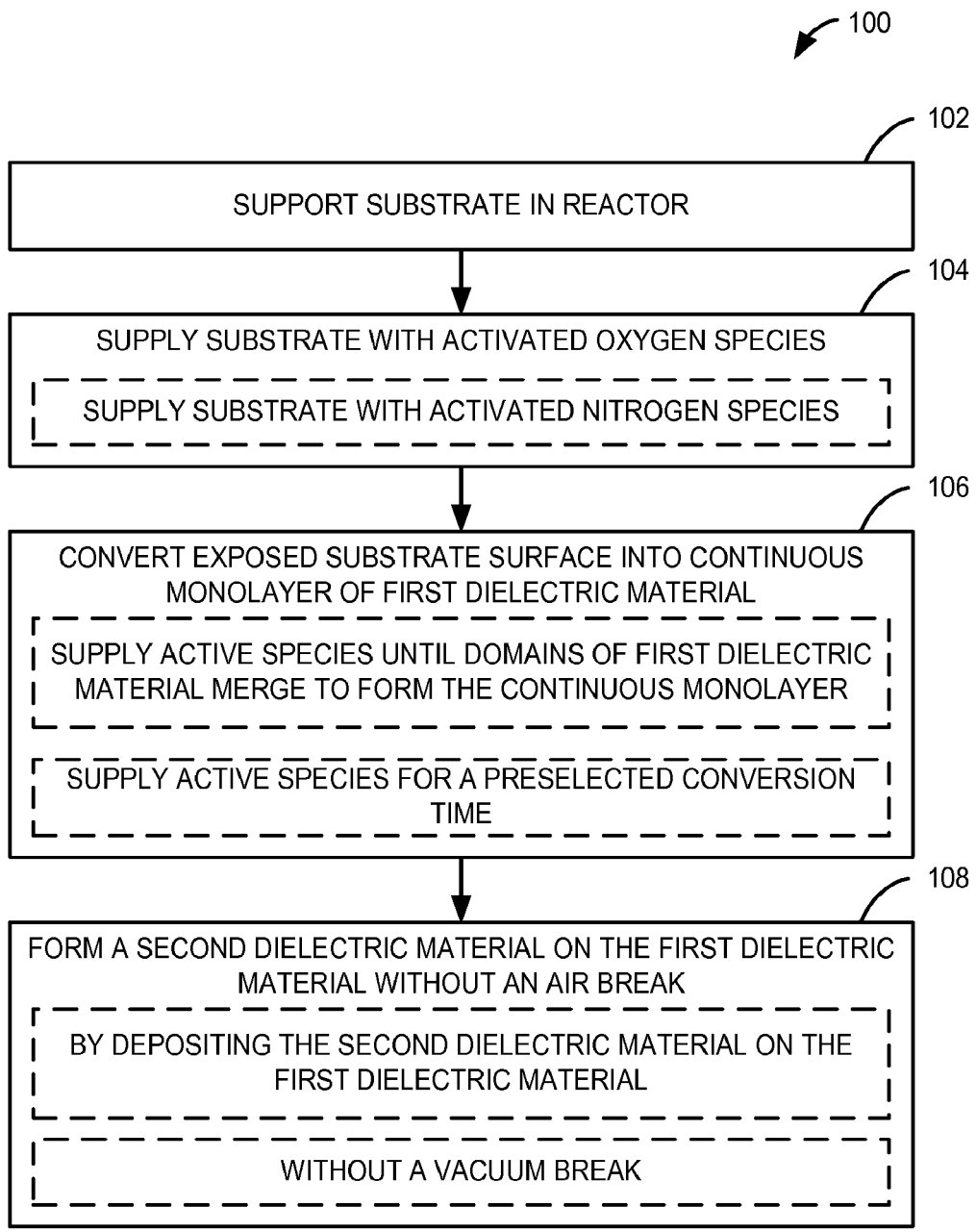
FIG. 1 shows a flowchart illustrating a portion of a method for forming a film stack on a substrate without an air break according to an embodiment of the present disclosure.

Modern semiconductor devices may include high-K gate dielectric materials to improve device performance relative to devices employing a $SiO_2$ gate dielectric at a given architectural size. The thickness of the gate dielectric material may shrink with the transistor size to provide a desired gate capacitance and/or drive current. The physical thickness of a $SiO_2$ gate dielectric may eventually become small enough so that leakage from the gate to the channel (e.g., from tunneling effects) raises power dissipation in the device to unacceptably high levels.

One approach to mitigate this effect is to replace the $SiO_2$ gate dielectric with a gate dielectric material having a dielectric constant value (K) that is relatively higher than the dielectric constant for $SiO_2$ (K~3-4). For example, some semiconductor devices employ $HfO_2$ (K~20-25), which may provide an equivalent oxide thickness (EOT) to a physically thinner layer of $SiO_2$. In turn, a gate including a high-K gate dielectric material may provide similar device turn-on characteristics while mitigating gate leakage and power dissipation.

As used herein, a high-K dielectric material refers to any suitable dielectric material having a dielectric constant greater than $SiO_2$. Accordingly, some transition metal oxides such as $HfO_2$ and $TiO_2$ (K~50) may be considered high-K dielectric materials. Other example high-K dielectric materials include, but are not limited to $HfO_x$, $TiO_x$, $SrO_x$, $ZrO_x$, and $LaO_x$. Some non-transition metal-including oxides such as $Al_2O_3$ (K~8) may be considered high-K dielectric materials. MgO is another non-limiting example of a non-transition metal-including oxide. Some high-K dielectric materials may have a dielectric constant of 200 or more (e.g., ultra-high-K dielectric materials), such as some alkaline earth metal-including metal oxides. For example, $SrTi_xO_y$, $BaTi_xO_y$, and $Sr_xBa_{(1-x)}Ti_yO_z$ may be considered high-K dielectric materials.

However, forming a high-K dielectric material directly on some substrates may lead to undesirable reaction between the substrate and the high-K dielectric material or one or more precursors used to form the high-K dielectric material. For example, a layer of $HfO_2$ formed directly on a silicon substrate may form a hafnium silicide, potentially degrading the intended performance character of the device. One approach to managing interactions between high-K materials and underlying substrates is to form a protective oxide barrier layer on the substrate prior to deposition of the high-K material. For example, an interlayer oxide may be formed on the substrate between the substrate and the high-K gate dielectric to restrict or prevent diffusion of metal cations from the high-K material or from a precursor used to form the high-K gate dielectric material into the substrate.

However, some of the methods of forming interlayer oxides rely on native oxide growth processes that can be difficult to control. For example, one approach for forming a chemical oxide of $SiO_2$ on a silicon substrate uses an HF wet bath to strip the substrate back to bare silicon. The chemical oxide is then formed according to a "Standard Clean 1" or "SC1" process using a wet bath comprising $NH_4OH$, $H_2O_2$, and $H_2O$. Diffusion boundary layers formed within the liquid near the substrate surface may make it difficult to control the thickness of an oxide formed using a wet bath short of an equilibrium thickness that may be undesirably thick. For example, some chemical oxides may have a thickness approaching 7 to 8 Å, a thickness that may contribute at an undesirable level to the EOT of a device including a high-K gate dielectric.

Accordingly, the embodiments described herein are related to methods for forming a film stack on a substrate. One example method comprises exposing the substrate to an activated oxygen species and converting an exposed surface of the substrate into a continuous monolayer of a first dielectric material. The example method also includes forming a second dielectric material on the continuous monolayer of the first dielectric material without exposing the substrate to an air break.

The embodiments described herein are also related to methods for determining a conversion time associated with converting an exposed surface of a substrate into a continuous monolayer of a first dielectric material. One example method includes converting the exposed surface of the substrate into the first dielectric material via reaction of an activated oxygen species with the exposed surface of the substrate and then forming a second dielectric material on the first dielectric material without an air break. The example method also includes measuring a thickness of the second dielectric material and determining that a continuous monolayer of the first dielectric material is formed on the exposed surface of the substrate if the thickness matches a preselected thickness.

The embodiments described herein are also related to film stacks used for semiconductor device gate assemblies. In one example, a gate assembly for a semiconductor device comprises a continuous monolayer of a first dielectric material formed from an exposed surface of a semiconducting substrate via reaction of the exposed surface with an activated oxygen species and a high-K dielectric material formed upon the first dielectric material without an intervening air break.

Forming a high-K dielectric material on the first dielectric material without an air break may avoid spontaneous oxidation caused by exposure to ambient conditions that may undesirably thicken the EOT of the device. Such spontaneous oxidation processes may be uncontrolled, potentially causing device performance to vary across the substrate and/or the device. Further, avoiding an air break during processing may also prevent the introduction of contaminants and/or small particles within the device that may degrade performance.

Moreover, by controlling formation of the first dielectric material to a continuous monolayer, the contribution to the device's EOT from the first dielectric material may be managed with more precision than boundary layers formed from native growth processes, such as ambient air exposure and/or chemical oxide formation in a wet bath. For example, in some embodiments, formation of a continuous monolayer of $SiO_2$ on a silicon substrate as described herein may provide an SiO2 film that is physically less than or equal to 6 Å thick. Further, in some embodiments disclosed herein, a gate assembly formed from a film stack comprising a continuous monolayer of $SiO_2$ formed from a silicon using an oxygen plasma and an $HfO_2$ high-K dielectric film formed thereon without an air break may reduce device EOT by approximately 20% relative to devices having the same physical thickness of $HfO_2$ (within an acceptable tolerance) deposited on an $SiO_2$ layer formed via a chemical oxide generated by an HF strip followed by an SC 1 wet bath.

FIG. 1 shows a flowchart illustrating an embodiment of a method 100 for forming a film stack including a continuous monolayer of a first dielectric material and a second dielectric material formed on the first dielectric material without an air break. It will be appreciated that embodiments of method 100 may be performed by any suitable hardware and software, including the hardware and software described herein. It will be appreciated that portions of the processes described in method 100 may be omitted, reordered, and/or supplemented without departing from the scope of the present disclosure.

Method 100 comprises, at 102, supporting a substrate in a reactor. A first dielectric material may be formed on an exposed surface of any suitable substrate without departing from the present disclosure. In some embodiments, supporting the substrate in the reactor may include adjusting one or more reactor conditions, such as temperature, pressure, plasma processing conditions, and/or inert gas (e.g., Ar, $N_2$, or He) flow rate, to conditions suitable for film formation prior to processing the substrate, though it will be appreciated that such adjustments may be made at any suitable point during substrate processing. It will also be appreciated that such film formation conditions may vary according to film process chemistry, substrate surface termination, and so on. Further, in some embodiments, reactor conditions may be adjusted to avoid undesirable reactions in the process environment and/or on the substrate. For example, reactor conditions may be adjusted to avoid gas phase decomposition reactions for one or more of precursors and/or reactants, potentially avoiding film contamination from decomposition products and/or poor step coverage resulting from diffusion effects. Further, in some scenarios, reactor conditions may be adjusted to avoid condensation of precursors and/or reactants on various reactor surfaces, potentially avoiding small particle defect generation processes.

For example, Table 1, presented below, provides non-limiting examples for process conditions suitable for forming a first dielectric layer of $SiO_2$ on and/or within a surface of a silicon substrate and for forming a second dielectric layer of $HfO_2$ on the first dielectric layer without an intervening air break.

TABLE 1

|  | Lower Range Example | Middle Range Example | Upper Range Example |
|---|---|---|---|
| First dielectric material conversion process: Si converted to $SiO_2$ using an oxygen plasma | | | |
| Temperature (° C.) | 25 | 50 | 400 |
| Total pressure (Torr) | 0.5 | 1 | 5 |
| Plasma power (W) | 10 | 50 | 200 |
| Oxygen flow rate (sccm) | 10 | 100 | 1000 |
| Diluent flow rate (sccm) | 100 | 500 | 3000 |
| Conversion Time (sec) | 0.1 | 1 | 60 |
| Second dielectric material conversion process: $HfO_2$ deposited using atomic layer deposition | | | |
| Temperature (° C.) | 200 | 300 | 400 |
| Total pressure (Torr) | 1 | 4 | 9 |
| Dosing times for precursor ($HfCl_4$) and reactant ($H_2O$) | 0.1 | 2 | 10 |

At 104, method 100 comprises supplying an exposed substrate surface with activated oxygen species. As used herein, an activated oxygen species generally refers to a chemically active state of oxygen generated from an oxygen-including reactant. In some embodiments, activated oxygen species may be provided by an ozone source. For example, ozone may be provided by an ozone generator supplied with oxygen. In some embodiments, activated oxygen species may be provided by an oxygen plasma source. In one scenario, activated oxygen ions may generated from oxygen gas by plasma formed proximate to the substrate (e.g., direct plasma). In another scenario, the activated oxygen ions may be supplied from an oxygen plasma generated away from the substrate surface (e.g., remote plasma). It will be appreciated that selection of a source for generating an activated oxygen species may depend on one or more application-related criteria, such as sensitivity of the substrate to ion bombardment, a desired flux of activated oxygen species at the substrate surface, a desired penetration depth of the activated oxygen species within the substrate surface, and so on. Such considerations or others may also affect selection of the activated oxygen species.

While the description above generally relates to the conversion of an exposed substrate surface into a layer of an oxygen-including dielectric material, it will be appreciated that any other suitable material may also be included in the first dielectric material without departing from the scope of the present disclosure.

For example, in some embodiments, nitrogen may also be included in the first dielectric material to adjust one or more electrical and/or physical characteristics of the first dielectric material, such as the dielectric constant, etch rate, and so on. Accordingly, in some embodiments, supplying the exposed surface with activated oxygen species at 104 may include supplying the exposed surface with an activated nitrogen species. As used herein, an activated nitrogen species generally refers a chemically active state of nitrogen generated from a nitrogen-including reactant. In some embodiments, activated nitrogen species may be provided by a nitrogen plasma source. In one scenario, activated nitrogen ions may generated from nitrogen gas by direct plasma, while, in another scenario, activated nitrogen ions may be supplied by remote plasma.

It will be appreciated that, if supplied, an activated nitrogen species may be provided by a source that is different than a source used to supply activated oxygen species in some embodiments, though in some instances the activated nitrogen and oxygen species may be generated by a common generation source. Further, it will be appreciated that selection of a source for generating an activated nitrogen species may depend on one or more of the application-related criteria noted above or on other suitable factors. Such considerations or others may also affect selection of the activated nitrogen species.

At 106, method 100 comprises converting an exposed surface of the substrate into a continuous monolayer of the first dielectric material. The activated oxygen species, and in some embodiments, the activated nitrogen species, reacts with the surface of the substrate material to form the first dielectric material. The conversion reaction transforms the exposed surface of the substrate into the first dielectric material. Put differently, the activated species consumes a portion of the exposed surface of the substrate to generate the first dielectric material. For example, in some embodiments, activated oxygen species may react with exposed surfaces of a silicon substrate to convert those surfaces into suitable silicon oxides ($SiO_x$), such as $SiO_2$. In some other embodiments, activated oxygen and nitrogen species may react with exposed surfaces of a silicon substrate to convert those surfaces into suitable silicon oxynitrides ($SiO_xN_y$), such as SiON.

The conversion reaction is performed until a continuous monolayer of the first dielectric material is formed. As used herein, a continuous monolayer refers to an uninterrupted single layer, within an acceptable tolerance, of a specified material, such as the first dielectric material. Without wishing to be bound by theory, activated species supplied to the substrate may react with the substrate to form islands or domains of the first dielectric material. Continued supply of the activated species may cause new domains to form and existing domains to grow until the domains merge together to form a continuous monolayer.

It will be appreciated that the physical characteristics of a monolayer may depend upon the material being formed. For example, a $SiO_2$ film formed within a silicon substrate may have a monolayer thickness of approximately 4 Å based upon the bond length and unit cell dimensions for $SiO_2$. Other dielectric materials formed from silicon substrates, such as silicon suboxides and silicon oxynitrides may have different monolayer thicknesses. Dielectric materials formed from other substrate materials may also have different monolayer thicknesses that are specific to the selected material systems.

Because the conversion process described above consumes a portion of the substrate, it will be appreciated that activated species may diffuse through the first dielectric material to reach unreacted substrate. If several layers of dielectric material accumulate, these diffusional effects may slow or halt the conversion of the substrate material. However, because several layers of dielectric material may compromise device performance, the supply of active species is managed so that the supply is curtailed after generating a continuous monolayer of the dielectric material. It will be appreciated that the supply may be controlled in any suitable manner without departing from the scope of the present disclosure. In some embodiments, activated species may be supplied only during a predetermined conversion time. Selection of the predetermined conversion time is discussed in more detail below with respect to FIGS. 3A and 3B.

At 108, method 100 comprises forming a second dielectric material on the first dielectric material without an air break. The second dielectric material may be formed on the first dielectric material in any suitable manner. For example, the second dielectric material may be formed on the first dielectric material by a thermal and/or plasma moderated deposition technique (e.g., atomic layer deposition or chemical vapor deposition). As one example of an atomic layer deposition technique, the second dielectric material may be deposited on the first dielectric material by adsorbing a dielectric material precursor on the continuous monolayer of the first dielectric material. A layer of the second dielectric material is then formed from interaction of the adsorbed precursor with a subsequently introduced reactant. Repeating the sequence builds additional layers of second dielectric material.

Forming the second dielectric material on the first dielectric material without an air break may avoid oxide growth caused by exposure of the first dielectric material to oxygen and/or humidity present at ambient conditions. In some settings where the first dielectric material is used as a liner or barrier layer prior to formation of a high-K dielectric, spontaneous oxidation caused by exposure to ambient conditions may undesirably thicken the EOT of the device. Moreover, because such spontaneous oxidation processes are relatively uncontrolled, the first dielectric material may vary in thickness across the substrate and/or the device. Further, forming the second dielectric material on the first dielectric material without an air break may also avoid exposing the surface of the first dielectric material to ambient contaminants and/or small particles that may interfere with subsequent processing.

Accordingly, in some embodiments, the first dielectric material may be formed in a first processing module of a semiconductor processing tool. The substrate may then be moved, without exposure to air or ambient humidity, to a second processing module included in the semiconductor processing tool for formation of the second dielectric material.

In some embodiments, forming the second dielectric material on the first dielectric material without an air break may include forming the second dielectric material on the first dielectric material without a vacuum break. In some of such embodiments, the first dielectric material may be formed in a first processing module of a semiconductor processing tool. The substrate may then be moved, without a vacuum break, to a second processing module included in the semiconductor processing tool for formation of the second dielectric material. In some other of such embodiments, the second dielectric material may be formed in the same processing module as the first dielectric material.

FIG. 2 schematically shows an embodiment of a film stack 200 that may be used to form a gate assembly for a semiconductor device. Film stack 200 may be formed by the methods disclosed herein or by any suitable method. Film stack 200 comprises a semiconducting substrate 202, a first dielectric material 204, and a second dielectric material 206.

It will be appreciated that semiconducting substrate 202 may include any suitable semiconducting substrate without departing from the scope of the present disclosure. Non-limiting examples of semiconducting substrate 202 include Si, Ge, SiGe, GaAs, InGaAs, and InP. In some embodiments, semiconducting substrate 202 may be formed as a suitable wafer, such as a 300-mm double-sided polished wafer of a suitable material. Further, semiconducting substrate 202 may have any suitable topography, including planar and non-planar surfaces.

First dielectric material 204 is a continuous monolayer formed by reaction of an exposed surface of semiconducting substrate 202 with an activated oxygen species. For example, in some embodiments, activated oxygen species may react with exposed surfaces of a silicon substrate to convert those surfaces into suitable silicon oxides ($SiO_x$), such as $SiO_2$. In some other embodiments, activated oxygen and nitrogen species may react with exposed surfaces of a silicon substrate to convert those surfaces into suitable silicon oxynitrides ($SiO_xN_y$), such as SiON. It will be appreciated that other suitable first dielectric materials may be formed from other substrate materials. For example, in embodiments where activated oxygen species is supplied to a Ge, SiGe, GaAs, InGaAs, or an InP substrate, first dielectric material 204 comprises a continuous monolayer of $GeO_x$, $SiGeO_x$, $GaAsO_x$, $InGaAsO_x$, or $InPO_x$, respectively. In embodiments where activated oxygen and nitrogen species are supplied to a Ge, SiGe, GaAs, InGaAs, or an InP substrate, first dielectric material 204 comprises a continuous monolayer of $GeO_xN_y$, $SiGeO_xN_y$, $GaAsO_xN_y$, $InGaAsO_xN_y$, or $InPO_xN_y$, respectively.

Second dielectric material 206 is a dielectric material formed on first dielectric material 204 without an intervening air break. In some embodiments, second dielectric material 206 may include a binary or a tertiary transition metal oxide. In some embodiments, second dielectric material 206 may include a high-K dielectric material. Non-limiting examples of second dielectric material 206 include $HfO_x$, $TiO_x$, $SrO_x$, $ZrO_x$, $LaO_x$, $SrTi_xO_y$, $AlO_x$, MgO, $BaTi_xO_y$, and $Sr_xBa_{(1-x)}Ti_yO_z$.

While not shown in FIG. 2, a suitable gate electrode may be formed on second dielectric material 206, so that first dielectric material 204 and second dielectric material 206 act as a gate dielectric for a gate assembly that includes the gate electrode. It will be appreciated that film stack 200 may be formed into a gate assembly for a semiconductor device by suitable patterning steps, potentially including one or more lithographic, etch, and mask steps. Other structures, including spacers, contacts, source and drain regions, and so on may also be included in a semiconductor device including a gate assembly that includes film stack 200.

Figure 3B:
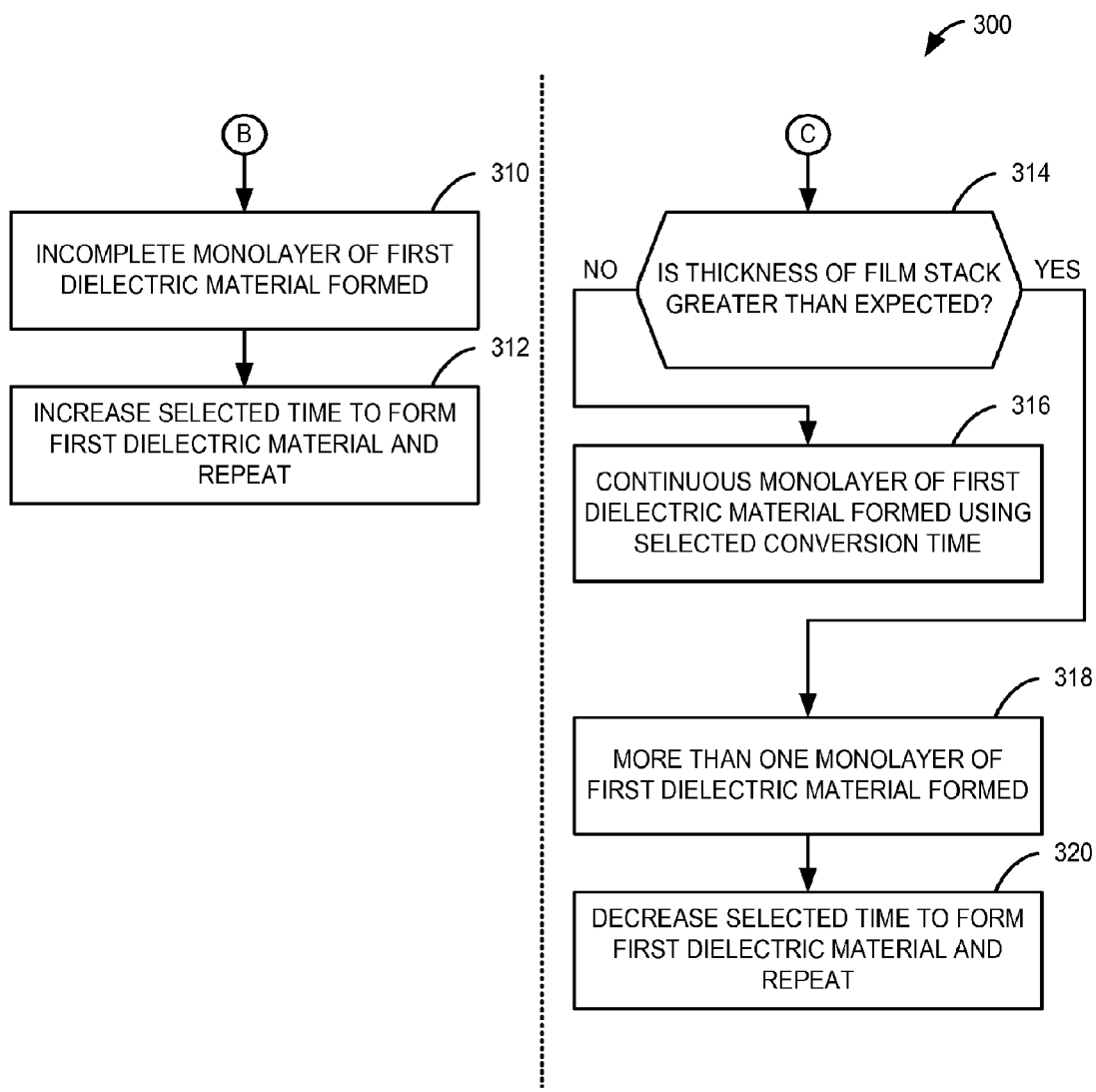
FIG. 3B shows a flowchart illustrating another portion of the method shown in FIG. 3A.

As introduced above, a continuous monolayer of the first dielectric is formed by converting at least enough of the substrate to form the continuous monolayer while curtailing conversion thereafter. FIGS. 3A and 3B show a flowchart that illustrates an embodiment of a method 300 for determining a conversion time associated with converting an exposed surface of a silicon substrate into a continuous monolayer of a first dielectric material comprising silicon dioxide according to an embodiment of the present disclosure. It will be appreciated that embodiments of method 300 may be performed by any suitable hardware and software, including the hardware and software described herein. It will be appreciated that portions of the processes described in method 300 may be omitted, reordered, and/or supplemented without departing from the scope of the present disclosure. For example, it will be appreciated that various decision structures included in method 300 may be altered, omitted, or supplemented in some embodiments involving other substrate materials, other first dielectric materials, and/or other second dielectric materials.

At 302, method 300 comprises supplying an active species to exposed surfaces of a silicon substrate for a selected time to form $SiO_2$. The time selected for converting the substrate to the $SiO_2$ may be any suitable time, which may be adjusted as described in more detail below. While it will be appreciated that any suitable process variable such as temperature, pressure, partial pressure, plasma power, and so on may be adjusted during conversion 302, it is preferable that those process parameters be selected in advance. In turn, method 300 may be focused on time selection for a particular substrate material conversion process, which may expedite time selection and overall process development.

At 304, method 300 comprises forming $HfO_2$ on the $SiO_2$ without an air break. Forming the second dielectric material at 304 includes processing the substrate under conditions suited to form a predetermined amount or thickness of the $HfO_2$ layer on the $SiO_2$ layer. In some of such embodiments, the substrate may be processed for a predetermined film formation time. For example, in some embodiments where the second dielectric material is deposited by a thermal- or plasma-based chemical vapor deposition technique, the substrate may be processed for a predetermined deposition time. In some embodiments where the second dielectric material is deposited by an atomic layer deposition technique, the substrate may be processed for a predetermined number of film formation cycles.

Processing the substrate so as to form a predetermined amount of the second dielectric material may provide an approach to identifying whether the $SiO_2$ film was sufficiently formed into a closed, continuous monolayer of film. In some settings, a precursor used to form the second dielectric material may adsorb at a different rate on the substrate than on the $SiO_2$. Relative differences in adsorption rate and/or extent of adsorption may be due to differences in the chemical termination of those surfaces.

For example, $HfO_2$ may be deposited using atomic layer deposition by sequentially supplying a substrate with separate, alternating doses or pulses of a hafnium-including precursor and an oxygen-including reactant. Reactions 1 and 2 illustrate a simplified form of the two processes that make up a sequential cycle used to form a layer of $HfO_2$ using atomic layer deposition.

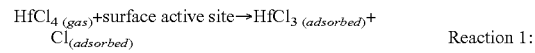

Reaction 1:

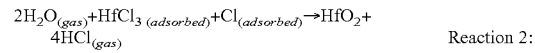

Reaction 2:

It will be appreciated that not all sites on the substrate surface may be active for adsorbing precursor. In some settings, the chemical termination of the surface may affect the population of surface active sites. For example, a surface terminated with hydrogen may be less reactive to some processes than a surface terminated with hydroxyl groups. Without wishing to be bound by theory, hydrogen-terminated surfaces may have fewer dangling bonds relative to other surface substituent groups, potentially providing a lower energy and less reactive surface. Accordingly, some surfaces may undergo a surface transformation before the surface is active for film formation. For example, water may be split to transform the surface from a hydrogen-terminated state into a hydroxyl-terminated state. It may take one or more sequential cycles to nucleate surface active sites suited for precursor adsorption and film deposition. Meanwhile, little film formation may occur during surface active site nucleation.

The delay associated with preparing the surface for subsequent film formation may be referred to as a nucleation phase. It will be appreciated that the duration of the nucleation phase, if any exists, may vary according to the identities of the substrate and the precursor. The nucleation phase duration may also vary according to an identity of the first dielectric material and the extent of conversion of the substrate surface to the first dielectric material. As introduced above, in some settings, a precursor used to form the second dielectric material may adsorb at a different rate on the substrate than on the first dielectric material. For example, a silicon substrate may be hydrogen terminated while a silicon oxide surface formed from the silicon substrate may be terminated with a non-hydrogen species, such as a surface hydroxyl. In some of such examples, a precursor used for forming the second dielectric material, such as $HfCl_4$, may have a higher sticking probability on the silicon oxide surface than on the silicon surface. The difference in sticking probability may lead to a difference in a likelihood of forming the second dielectric material, as a precursor that is more likely to adsorb is may be more likely to participate in subsequent film-forming reactions.

Figure 4:
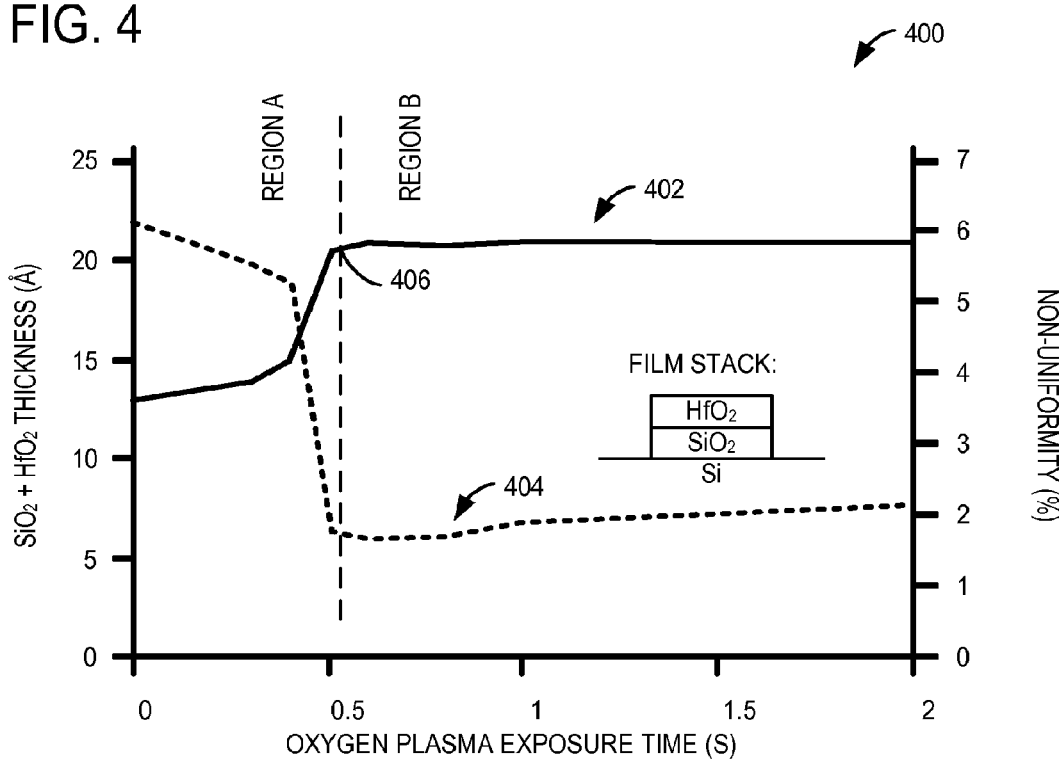
FIG. 4 shows ellipsometer data for film stacks formed according to an embodiment of the present disclosure.

For example, FIG. 4 shows ellipsometer data 400 for film stacks formed according to an embodiment of the methods described herein comprising a layer of $HfO_2$ formed on top of a layer of $SiO_2$ grown from a silicon substrate using an oxygen plasma. The $SiO_2$ layers represented in FIG. 4 have different thicknesses generated by varying the exposure of the silicon substrate to oxygen radicals and/or ions generated by direct oxygen plasma prior to deposition of $HfO_2$. An identical number of atomic layer deposition cycles were used when forming the $HfO_2$ layers. However, as explained in more detail below, the resulting thickness of $HfO_2$ may vary according to an extent of conversion of the silicon surface to $SiO_2$.

Ellipsometer data 400 includes film thickness data 402 and film non-uniformity data 404 collected as a function of oxygen plasma exposure time. Ellipsometer data 400 represents data averaged from a suitable number of measurement sites on the substrates. Thickness data 402 was collected from 49 measurement sites arranged on each substrate surface, though any suitable number of sites may be employed without departing from the scope of the present disclosure. Non-uniformity data 404 represents within-substrate non-uniformity, which was calculated by dividing the standard deviation of the measured thickness data by the average thickness. The calculated non-uniformity values are expressed as percentages by multiplying the results by 100.

For illustrative purposes, ellipsometer data 400 is divided into Region A and Region B. Region A illustrates a portion of ellipsometer data 400 roughly corresponding to a silicon surface that exhibits no conversion to $SiO_2$ or conversion to less than a continuous monolayer of $SiO_2$. Consequently, some of the atomic layer deposition cycles are used transforming the surface in a nucleation phase. Only the remaining atomic layer depositions cycles are able to deposit $HfO_2$ film on the surface. Because the total film deposited during the $HfO_2$ formation process in Region A is less than an amount that would ordinarily be deposited by an identical number of atomic layer deposition cycles, the total thickness shown in thickness data 402 in Region A is less than expected. Moreover, because the $HfO_2$ process begins with a nucleation process, islands of $HfO_2$ formed on the surface from nucleation sites may also lead to a surface that has a greater non-uniformity than expected, as shown in non-uniformity data 404.

Region B illustrates a portion of ellipsometer data 400 roughly corresponding to a silicon substrate exhibiting conversion to a continuous monolayer of $SiO_2$ prior to formation of $HfO_2$. Because the $SiO_2$ surface may be more susceptible to $HfO_2$ formation than a silicon surface, fewer atomic layer deposition cycles may be used in a nucleation phase in Region B than in Region A. In turn, more deposition cycles may be available for forming layers of $HfO_2$, so that the total thickness approaches an amount of $HfO_2$ that is expected to be deposited by those atomic layer deposition cycles. In settings where there is virtually no nucleation phase for forming $HfO_2$ on the $SiO_2$ surface, the thickness of $HfO_2$ formed may approach a theoretical value for atomic layer deposition. Further, because the $HfO_2$ films are formed on a continuous monolayer of film, the total film stack exhibits a more uniform surface relative to surfaces having discontinuous, sub-monolayer films of $SiO_2$ beneath the $HfO_2$, as shown in non-uniformity data 404.

In the example shown in FIG. 4, the duration of oxygen plasma corresponding to transition 406 represents the conversion time to form a continuous monolayer of silicon oxide from the silicon substrate for these conversion conditions. While other conversion conditions and/or material systems may have different conversion times, it will be appreciated that the approach described herein may also be employed to identify a conversion time for such conditions and/or systems. It will also be appreciated that extending the plasma duration may increase the thickness of the silicon oxide layer in some settings. In settings where the silicon oxide layer is included in a gate assembly, increasing the thickness of the silicon oxide layer may increase the EOT of the gate.

Figure 5:
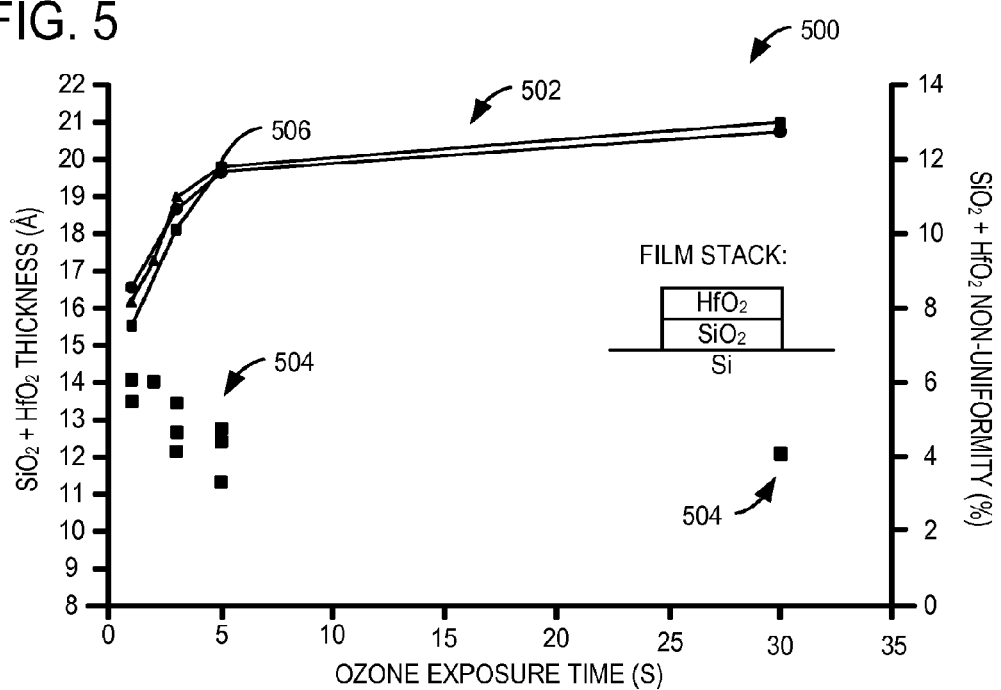
FIG. 5 shows ellipsometer data for film stacks formed according to an embodiment of the present disclosure.

FIG. 5 shows ellipsometer data 500 for film stacks formed according to an embodiment of the methods described herein comprising a layer of $HfO_2$ formed on top of a layer of $SiO_2$ grown from a silicon substrate using ozone. Thickness data 502 and non-uniformity data 504 exhibit behavior like that described above regarding FIG. 4. In the example shown in FIG. 5, transition 506 indicates that a continuous monolayer of $SiO_2$ is formed from the silicon substrate after approximately 5 seconds of ozone exposure under those conversion conditions.

Returning to FIG. 3A, at 306, method 300 comprises measuring a thickness of a film stack comprising the $SiO_2$ and $HfO_2$ films. The measured value provides a basis for determining whether the $SiO_2$ exists in a continuous monolayer, as explained in more detail below. It will be appreciated that any suitable technique for measuring the $HfO_2$ may be employed without departing from the scope of the present disclosure. For example, thickness may be measured by an optical technique (e.g., ellipsometry), by a microscopy technique (e.g., transmission electron microscopy), by an electron spectroscopy technique (e.g., X-ray photoelectron spectroscopy), and so on.

At 308, method 300 comprises determining whether the thickness of the film stack is less than expected based upon the $HfO_2$ formation conditions. In turn, it may be possible to determine whether a continuous monolayer of $SiO_2$ is formed. If the thickness of the film stack is less than expected, method 300 continues to 310 in FIG. 3B. At 310, it is determined that, because the thickness of the film stack (or in some embodiments, the thickness of the $HfO_2$ layer) is less expected for the given $HfO_2$ formation conditions, an incomplete or discontinuous monolayer of the first dielectric material may have been formed.

Without wishing to be bound by theory, a thinner than expected $HfO_2$ layer may result when an $HfO_2$ precursor or reactant has a higher probability of sticking on the $SiO_2$ than on the silicon substrate. Initial formation of the $HfO_2$ layer on the silicon substrate may be inhibited by a nucleation phase that is longer than a nucleation phase associated with forming the $HfO_2$ layer on $SiO_2$, causing the $HfO_2$ layer to be thinner than expected. Consequently, at 312, method 300 includes increasing the selected conversion time and repeating method 300. Increasing the selected conversion time may provide additional time for the $SiO_2$ material to close into a continuous monolayer.

If the thickness of the film stack is not less than expected at 308, method 300 continues to 314 in FIG. 3B. At 314, method 300 comprises determining whether the thickness of the film stack is greater than expected, which may indicate that the $SiO_2$ layer thickness exceeds one monolayer. If the thickness of the film stack is not greater than expected, method 300 continues to 316, where it is determined that a continuous monolayer of $SiO_2$ was formed. In turn, the conversion time selected for conversion 302 may be used to form a continuous monolayer of $SiO_2$.

If the thickness of the film stack is greater than expected, method 300 continues to 318, where it is determined that more than one monolayer of $SiO_2$ was formed. Consequently, at 320, method 300 includes decreasing the selected conversion time and repeating method 300. Decreasing the selected conversion time may reduce the time available for the $SiO_2$ material to grow beyond a continuous monolayer.

It will be appreciated that the silicon/$SiO_2$ example disclosed above is merely illustrative, and that some portions of method 300 may vary according to materials- and/or process-related considerations. In some embodiments, determinations based on thickness comparisons may be related to the extent of conversion of the substrate into the first dielectric material may depend on a sticking probability of a precursor, reactant, and/or reaction product (e.g., a gas phase deposition product participating in a CVD reaction) associated with formation of the second dielectric material on the first dielectric material relative to the substrate. In some embodiments, determinations based on thickness comparisons may be related to variations in substrate and first dielectric material physical surface conditions (e.g., faceting and so on) and chemical surface conditions (e.g., the population of dangling bonds, surface adsorbed groups including hydrogen, hydroxyl, and so on).

For example, if a precursor used to form the second dielectric material has a higher sticking probability on the substrate than on the first dielectric material, the thickness of the second dielectric material may be greater than expected. In such embodiments, the greater-than-expected thickness may be used to increase the selected conversion time. Further, in some of such embodiments, the measured thickness of the second dielectric material, on its own, may be helpful in distinguishing between a film stack comprising an incomplete, discontinuous layer of first dielectric material and a film stack comprising more than one monolayer of the first dielectric material.

Figure 6:
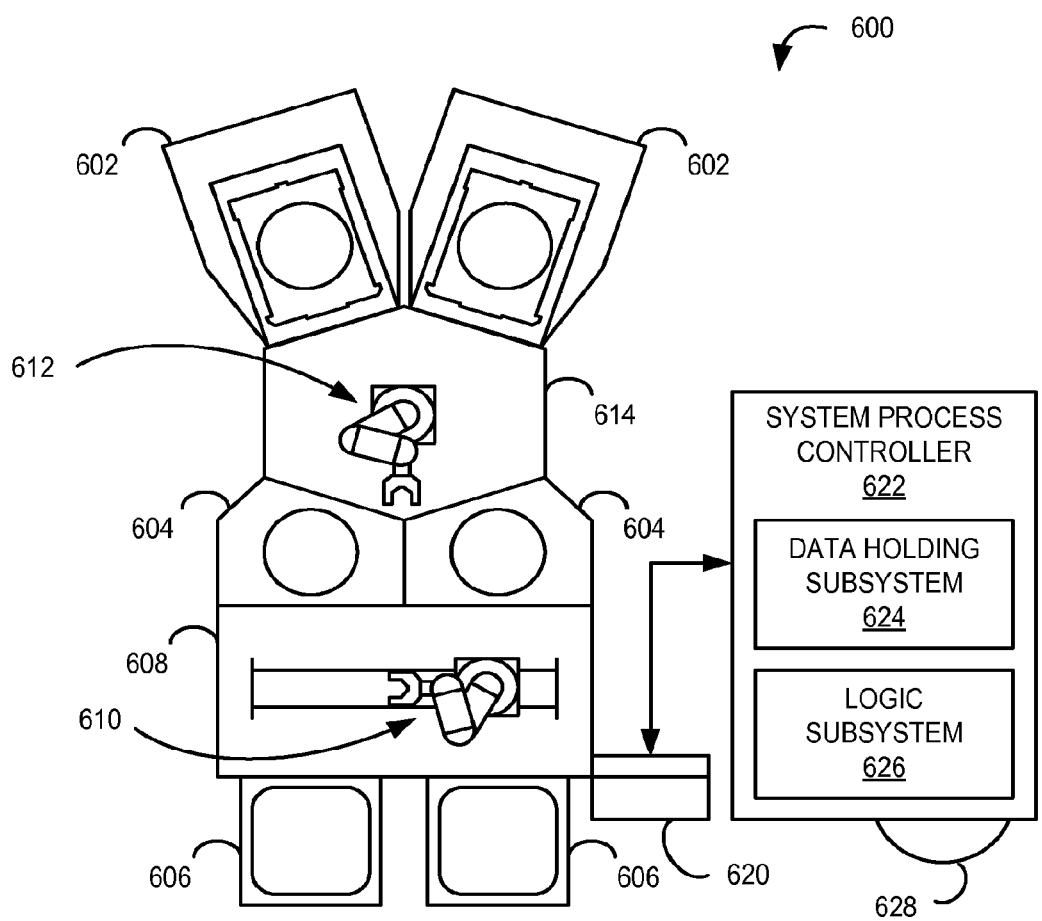
FIG. 6 schematically shows an example semiconductor processing tool according to an embodiment of the present disclosure.

In some embodiments, the film stacks and structures described herein may be formed using a suitable semiconductor processing tool. FIG. 6 schematically shows a top view of an embodiment of a semiconductor processing tool 600 including a plurality of semiconductor processing modules 602. While the depicted embodiment includes two modules, it will be appreciated that any suitable number of semiconductor processing modules may be provided. For example, some processing tools may include just one module while other processing tools may include more than two modules.

FIG. 6 also shows load locks 604 for moving substrates between portions of semiconductor processing tool 600 that exhibit ambient atmospheric pressure conditions and portions of the tool that are at pressures lower than atmospheric conditions. An atmospheric transfer module 608, including an atmospheric substrate handling robot 610, moves substrates between load ports 606 and load locks 604, where a portion of the ambient pressure is removed by a vacuum source (not shown) or is restored by backfilling with a suitable gas, depending on whether substrates are being transferred into or out of the tool. Low-pressure substrate handling robot 612 moves substrates between load locks 604 and semiconductor processing modules 602 within low-pressure transfer module 614. Substrates may also be moved among the semiconductor processing modules 602 within low-pressure transfer module 614 using low-pressure substrate handling robot 612, so that sequential and/or parallel processing of substrates may be performed without exposure to air and/or without a vacuum break.

FIG. 6 also shows a user interface 620 connected to a system process controller 622. User interface 620 is adapted to receive user input to system process controller 622. User interface 620 may optionally include a display subsystem, and suitable user input devices such as keyboards, mice, control pads, and/or touch screens, for example, that are not shown in FIG. 6.

FIG. 6 shows an embodiment of a system process controller 622 provided for controlling semiconductor processing tool 600. System process controller 622 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 622 comprises a computing system that includes a data-holding subsystem 624 and a logic subsystem 626. Data-holding subsystem 624 may include one or more physical, non-transitory devices configured to hold data and/or instructions executable by logic subsystem 626 to implement the methods and processes described herein. Logic subsystem 626 may include one or more physical devices configured to execute one or more instructions stored in data-holding subsystem 624. Logic subsystem 826 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 628, which may be used to store and/or transfer data and/or instructions executable to implement the methods and processes described herein, excluding a signal per se. It will be appreciated that any suitable removable computer-readable storage media 628 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of forming a film stack on a substrate, the method comprising:
   determining a conversion time for converting an exposed surface of a substrate into a continuous monolayer;
   under vacuum conditions, exposing the substrate to a plasma activated oxygen species for the conversion time;
   converting an exposed surface of the substrate into a continuous monolayer of a first dielectric material; and
   forming a second dielectric material on the continuous monolayer of the first dielectric material without exposing the substrate to an air break,
   wherein the step of determining a conversion time comprises measuring a thickness of a film stack comprising the first dielectric material and the second dielectric material.

2. The method of claim 1, where converting the exposed surface into the continuous monolayer includes supplying the plasma activated oxygen species to the exposed surface until domains of the first dielectric material formed by reaction of the plasma activated oxygen species with the substrate merge into the continuous monolayer.

3. The method of claim 1, where forming the second dielectric material comprises depositing the second dielectric material by adsorbing a dielectric material precursor on the continuous monolayer of the first dielectric material.

4. The method of claim 1, where forming the second dielectric material without exposing the substrate to an air break comprises forming the second dielectric material without exposing the substrate to a vacuum break.

5. The method of claim 1, where exposing the substrate to the plasma activated oxygen species includes exposing the substrate to an activated nitrogen species.

6. The method of claim 1, where the substrate is selected from the set consisting of Si, Ge, SiGe, GaAs, InGaAs, and InP, and where the first dielectric material is selected from the set consisting of $SiO_xN_y$, $SiO_x$, $GeO_xN_y$, $GeO_x$, $SiGeO_xN_y$, $SiGeO_x$, $GaAsO_xN_y$, $GaAsO_x$, $InGaAsO_xN_y$, $InGaAsO_x$, $InPO_xN_y$, and $InPO_x$.

7. The method of claim 1, where the second dielectric material includes a high-K dielectric material.

8. The method of claim 7, wherein the high-K dielectric material has a dielectric constant greater than the dielectric constant of $SiO_2$.

9. The method of claim 1, where the plasma activated oxygen species is provided by one or more of an ozone source and a remote oxygen plasma source.

10. The method of claim 1, where the substrate is hydrogen terminated and where the first dielectric material is non-hydrogen terminated.

11. The method of claim 1, where the step of converting an exposed surface of the substrate into a continuous monolayer comprises exposing the substrate to a vacuum pressure between 0.5 Torr and 5 Torr.

12. The method of claim 1, where the step of forming a second dielectric material comprises exposing the substrate to a vacuum pressure between 1 Torr and 9 Torr.

13. The method of claim 1, where the second dielectric is selected from the group consisting of $HfO_x$, $TiO_x$, $SrO_x$, $ZrO_x$, $LaO_x$, $SrTi_xO_y$, $AlO_x$, $MgO$, $BaTi_xO_y$, and $Sr_xBa_{(1-x)}Ti_yO_z$.

14. The method of claim 1, where the step of converting an exposed surface of the substrate and the step of forming a second dielectric material are performed in the same processing chamber.

15. The method of claim 1, where the step of converting an exposed surface of the substrate and the step of forming a second dielectric material are performed in different processing chambers.

16. The method of claim 1, wherein the film stack forms part of a semiconductor device gate assembly.

17. The method of claim 1, wherein a thickness of the continuous monolayer is less than or equal to 6 Angstroms.

18. The method of claim 1, wherein the plasma activated oxygen species is generated from oxygen gas.

19. The method of claim 1, wherein the plasma activated oxygen species is generated proximate the exposed surface of the substrate.

20. The method of claim 1, wherein the continuous monolayer comprises $SiO_xN_y$.

* * * * *